United States Patent
Olofsson et al.

[11] Patent Number: 6,166,918
[45] Date of Patent: Dec. 26, 2000

[54] PROTECTIVE SHIELD FOR ELECTRICAL COMPONENTS

[75] Inventors: Lars-Anders Olofsson, Järfälla; Sven-Erik Björksell, Stockholm, both of Sweden

[73] Assignee: Telefonaktiebolaget LM Ericsson, Stockholm, Sweden

[21] Appl. No.: 08/915,613

[22] Filed: Aug. 21, 1997

[30] Foreign Application Priority Data

Aug. 22, 1996 [SE] Sweden .................................. 9603048

[51] Int. Cl.⁷ ........................................................ H05K 9/00
[52] U.S. Cl. ........................ 361/800; 361/818; 174/35 R; 206/719
[58] Field of Search ............................ 361/752, 800, 361/799, 801, 816, 818; 174/35 GL, 51, 35 R; 206/719

[56] References Cited

U.S. PATENT DOCUMENTS

| | | |
|---|---|---|
| 4,754,101 | 6/1988 | Stickney et al. . |
| 4,977,483 | 12/1990 | Perretta ..................... 361/816 |
| 5,014,160 | 5/1991 | McCoy, Jr. ............................... 361/818 |
| 5,043,848 | 8/1991 | Rogers et al. ........................... 361/816 |
| 5,053,924 | 10/1991 | Kurgan . |
| 5,150,282 | 9/1992 | Tomura et al. . |
| 5,175,395 | 12/1992 | Moore ..................... 174/35 R |
| 5,353,201 | 10/1994 | Maeda ..................... 361/816 |
| 5,354,951 | 10/1994 | Lange, Sr. et al. . |
| 5,383,098 | 1/1995 | Ma et al. ................. 361/818 |
| 5,495,399 | 2/1996 | Gore et al. .............................. 361/814 |
| 5,506,374 | 4/1996 | Kawakami . |
| 5,545,843 | 8/1996 | Arvidsson et al. ................. 174/35 GC |
| 5,559,676 | 9/1996 | Gessaman ................. 361/752 |

FOREIGN PATENT DOCUMENTS 2 226 187  6/1990  United Kingdom .
WO95/28074  10/1995  WIPO .

*Primary Examiner*—Jayprakash N. Gandhi
*Attorney, Agent, or Firm*—Burns, Doane, Swecker & Mathis, L.L.P.

[57] ABSTRACT

The present invention relates to a protective shield (1) of EMC-type, for e.g. electrical components (40) on a circuit board (30). The protective shield (1) comprises a frame (10) with associated lid (20), where said frame (10) at the end facing towards the circuit board (30) comprises a flange (12). The frame is arranged to be fastened to the circuit board (30) by means of gluing, welding or soldering. The frame (10) is intended to surround at least one component (40) so that electrical contact is formed between said circuit board (30) and said frame (10) and between said frame (10) and said lid (20).

12 Claims, 3 Drawing Sheets

PROTECTIVE SHIELD FOR ELECTRICAL COMPONENTS

TECHNICAL FIELD

The present invention relates to a surface-mounted protective shield for components on e.g. a circuit board.

STATE OF THE ART

The screening of components on circuit boards is becoming more important, especially in the case when the signal speed approaches the Gbit region. It is well known that radiation from certain components at high frequencies can cause interference with communications e.g. telecommunication. This phenomenon is called RFI, radio frequency interference. The interfering circuits can either be shielded with closed boxes or the sensitive components can be shielded with closed boxes in order to prevent interference.

In GB 2 226 187 there is described a miniature protective shield for electronic components arranged on a circuit board. The protective shield comprises a number of contact springs and a lid. The contact springs are arranged around the component and are in electrical contact with the circuit board. The contact springs are in general U-shaped. The lid comprises a flat surface with side walls along all the edges so that the lid is similar to an open box. The size of this box is adapted to the contact springs on the circuit board. The sides are intended to be inserted into the U-shaped contact springs so that a protective shield is formed.

In WO 95/28074 a contact spring is described which can be used to connect a protective shield to a circuit board. This contact spring has a different appearance compared to the above mentioned contact springs, which means that the contact between lid and contact spring is ensured and that the shielding increases.

The problem of the above contact springs is that they are quite complicated to arrange around the component on the circuit board. This solution is, furthermore, not completely optimal, both with regard to space requirements and the degree of protection.

DISCLOSURE OF THE INVENTION

On circuit boards where certain components produce much electromagnetic radiation, the placement of these components must be chosen with great care so that the radiation shall not cause operational problems. On e.g. a single-sided circuit board, where both a transmitter and a receiver are placed, the minimum size of the circuit board is limited to how near each other the transmitter and receiver can be placed without causing operational disturbances.

A problem which occurs when different products tend towards smaller and smaller dimensions is that the screening between sensitive components must be increased.

Another problem is that known protective shields take up too much room and are complicated and time-consuming to place on the circuit board, either because they should be mounted in holes in the circuit board or because they should be held fixed during the soldering operation. The above mentioned problems often require hand assembly.

The present invention intends to solve above said problems through a surface-mounted protective shield, a so-called EMC-shield, being arranged over sensitive or disturbing components on a circuit board. The EMC-shield is in its most simple embodiment a frame with an associated lid arranged around at least one component on the circuit board. The frame is attached so that it is in electrical contact with the circuit board. The lid is adapted to the shape and size of the frame in order to obtain an EMC-protection which is as effective as possible.

The frame, which can have any possible shape, e.g. circular, triangular and rectangular, is optimized in size to precisely surround the component or components which are to be shielded. The frame, which can be made of some electrically conductive material or a material which is coated with an electrically conductive material, can have a flange at its end facing towards the circuit board. This flange can align the frame when it is fastened to the circuit board with the help of e.g. soldering, welding or gluing. A joint material, which is placed at the intended position on the circuit board next to the component which is to be shielded and with a shape corresponding to the contour of the frame, causes a frame which is not too greatly mispositioned to be displaced to the right position with the help of the surface tension of the joint material. The lid, which comprises a flat surface with walls arranged around all its sides, has its shape and size adapted to the frame so that the lid is either slipped onto the outside of the frame or placed inside it.

An advantage of the present invention is that the protective shield takes up minimal space and that it does not leak radiation through the frame.

Another advantage of the present invention is that the fastening is simplified in that the frame is formed of a unit which cannot tip over.

Yet another advantage of the present invention is that with a flange on the frame it can adjust itself to the right position.

Yet another advantage of the present invention is that the mounting on an assembly line is simplified and that simpler "pick and place" robots can be used.

The invention will now be described more closely with the help of preferred embodiments and with reference to the appended drawings.

PREFERRED EMBODIMENTS

Figure 1:
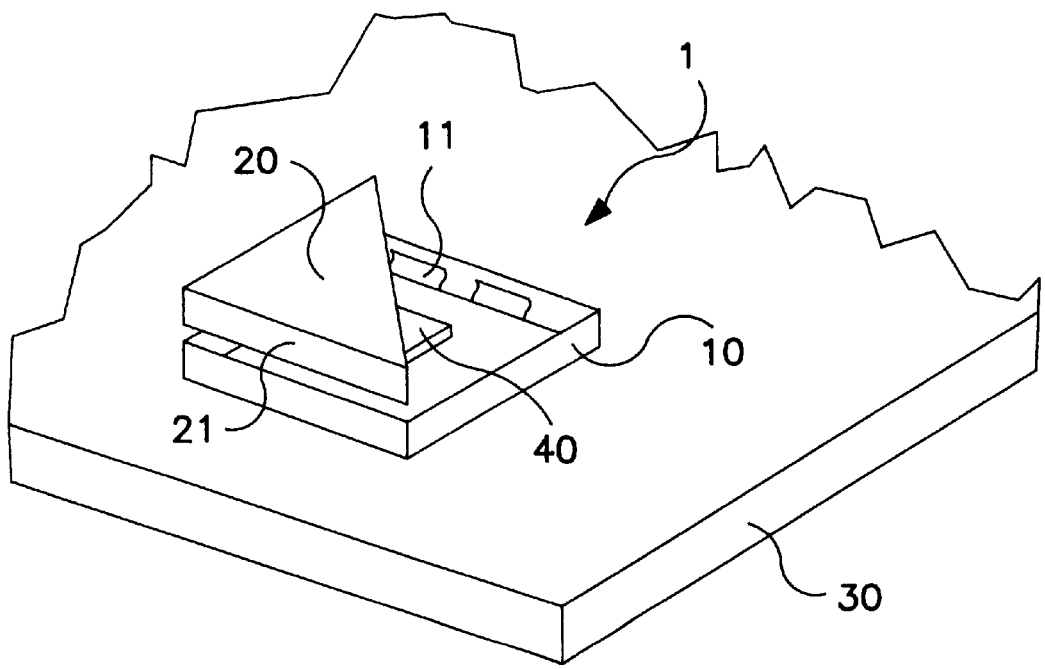
FIG. 1 shows in perspective an example of an embodiment of an EMC-protection according to the invention arranged on a substrate.
Figure 2:
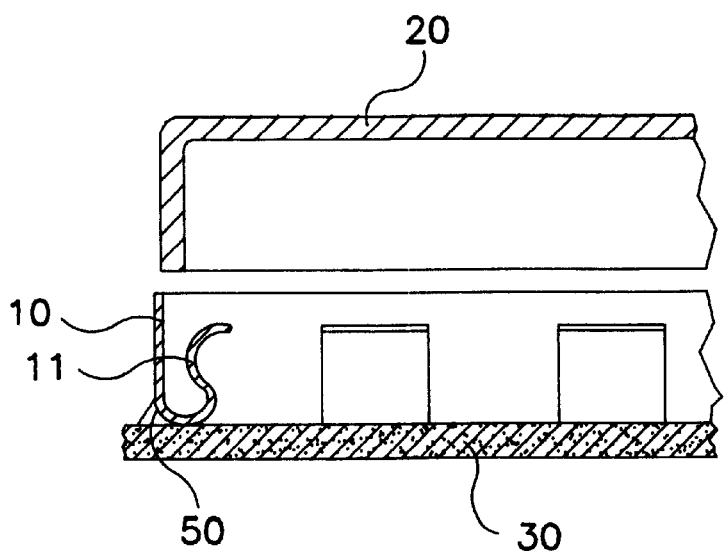
FIG. 2 shows a partial cross section of the EMC-protection in FIG. 1.

FIG. 1 shows an embodiment of a protective shield of the EMC-type 1 according to the invention. The protective shield 1 in this Figure is mounted on a substrate 30. The protective shield comprises a frame 10 and a lid 20. The frame 10 can be fastened to the substrate 30 with the help of gluing, welding or soldering. On the inside of the walls of the frame 10 there are a number of contact elements 11. These contact elements 11 in this embodiment are shaped as tension prongs. The outer dimensions of the lid 20 are adapted to the inner dimensions of the frame 10 according to FIG. 2. When the lid 20 is forced down into the frame 10, the side walls 21 of the lid 20 are gripped between the walls of the frame 10 and the tension prongs. The component 40, which one desires to shield, is placed inside the frame 10.

Said tension prongs can also be arranged on the outside of the frame 10. The inner dimensions of the lid 20 are in this case adapted to the shape and size of the outer dimensions of the frame 10 so that the side walls 21 of the lid 20 are clamped between the tension prongs and the outside of the frame 10.

Figure 3:
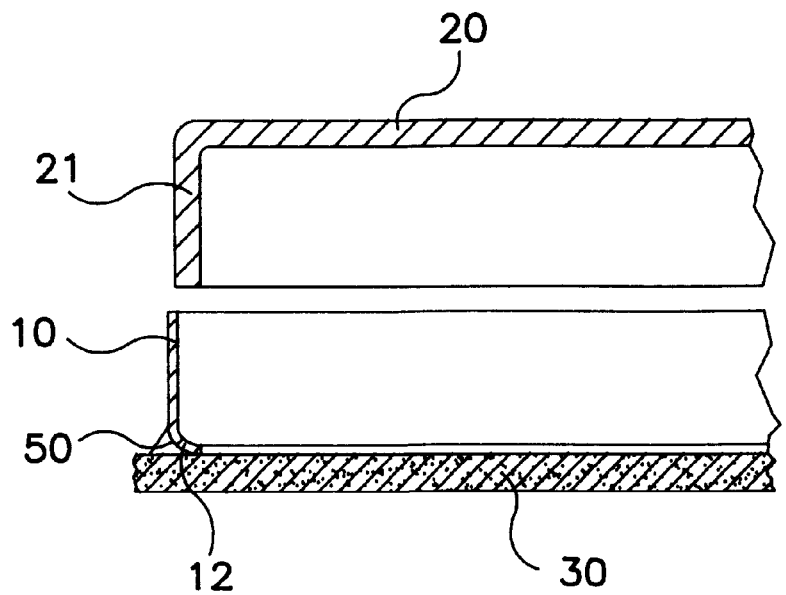
FIG. 3 shows a partial cross section of another example of an embodiment of the EMC-protection.

A variant for contacting the lid 20 to the frame 10 is that the outer dimension of the frame 10 is precisely adapted to the inner dimension of the lid 20 so that these details are mechanically held together and are in electrical contact with each other by the lid 20 being slipped over the frame 10 and contacting it by press-fitting. It is naturally also conceivable that the outer dimension of the lid 20 is adapted according to the inner dimension of the frame 10 so that the lid 20 fits inside the frame 10 so that said electrical contact and mechanical holding between these parts is again formed by press-fitting, see FIG. 3.

Figure 5:
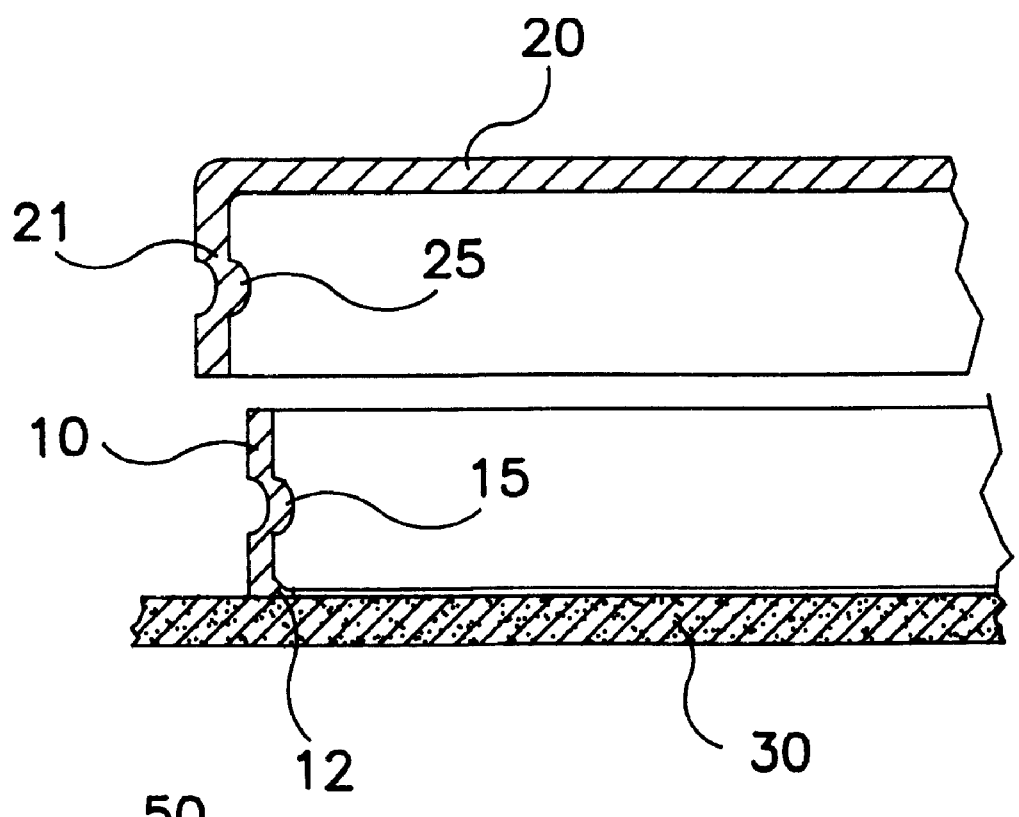
FIG. 5 shows a partial cross section of yet another example of an embodiment of the EMC-protection.

Instead of using tension prongs or press-fitting for forming electrical contact between the frame 10 and the lid 20, a number of other embodiments can be conceivably used. One variant could be that the frame 10 just like earlier is fastened to the substrate 30 in a suitable way. The lid 20 is dimensioned to either fit inside the frame 10 or be threaded over the frame 10. If the lid 20 is intended to fit into the frame 10, then on the outside of the side walls 21 of the lid 20 there could be arranged a number of contact means in the shape of ribs and on the inside of the frame 10 there could be arranged corresponding ribs. The ribs of the lid 20 and the ribs of the frame 10 snap into each other in order in this way to form the mechanical and electrical contact between the lid 20 and the frame 10, see FIG. 5.

Yet another variant can be that the frame 10 has a number of bulges 15 in the form of e.g. hemispheres which are adapted to corresponding spheres on the side walls 21 of the lid. If there are a number of bulges 25 arranged on the side walls 21 of the lid 20, then there are corresponding depressions 15 arranged on the frame 10. If on the side walls 21 of the lid 20 there are arranged a number of depressions 25, then there are corresponding bulges 15 arranged on the frame 10. The lid 20 can either be adapted to be slipped over the frame 10 or to fit inside it, the depressions or bulges 25 on the side walls 21 fitting into the corresponding bulges or depressions 15 on the frame 10, see FIG. 5. This embodiment plus the one with ribs are especially suitable in the case of small dimensions of the protective shield.

Figure 4:
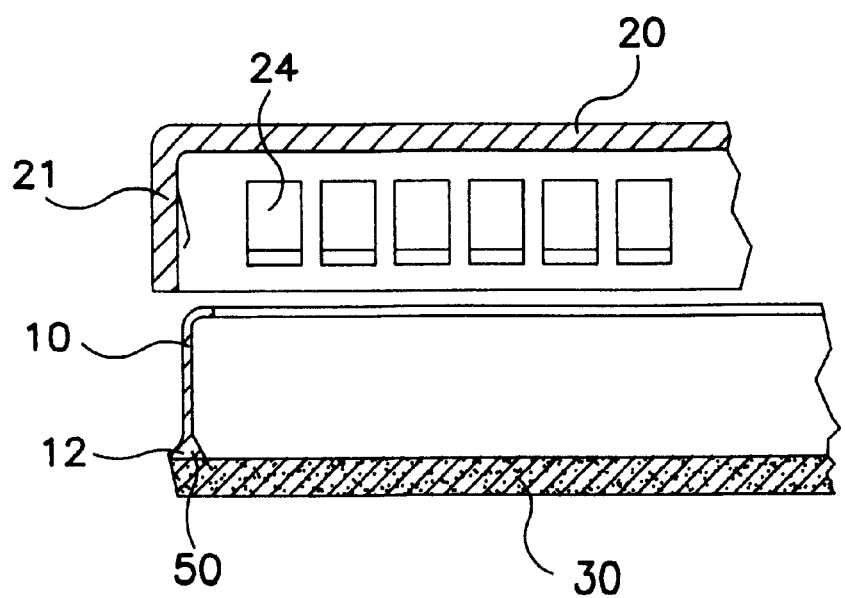
FIG. 4 shows a partial cross section of yet another example of an embodiment of the EMC-protection.

Yet another variant for contacting the lid 20 to the frame 10 is that the lid 20 is arranged with a number of tongues 24 along the side wall 21. These tongues 24 are bent in towards the center of the lid 20 when the lid 20 is to be slipped over the frame 10 and bent out from the center of the lid 20 when the lid 20 is to fit into the frame 10, see FIG. 4. The tongues can also at their free ends be bent in towards the side wall 21.

On the frame 10 there can be arranged a flange 12 at the end which is to be connected to the circuit board. The flange 12 can be directed in towards the center of the frame 10 as in FIG. 3, or out from the center of the frame 10 as in FIG. 4. The flange 12 means that the frame 10 can self-adjust to the right position with the help of the surface-tensioning of the fastening material 50. If the frame 10 is incorrectly placed in relation to a soldering material arranged on the circuit board 30, the frame 10 can move itself to the center of said soldering material when this begins to melt.

In order to achieve as good a shielding bandwidth as possible, the material in the EMC-protection can be manufactured in some electrically conductive material with magnetic qualities.

The walls of the frame 10 can be somewhat bent 12 at the bottom close to the substrate 30 to which the frame 10 is fastened. The bending of the walls close to the substrate can either be in towards the frame 10 or out from the same.

The invention is naturally not limited to the embodiments described above and shown in the drawings, but can be modified within the scope of the accompanying claims.

What is claimed is:

1. A protective shield for electrical components on a circuit board, the protective shield comprising:

a frame;

a lid associated with the frame;

the frame having a side wall and the side wall having an end having a flange, the flange having a surface extending perpendicularly to the side wall and adapted to be fastened to a circuit board by gluing, welding or soldering, the frame being adapted to surround at least one component, wherein electrical contact is formed between the circuit board and the frame and between the frame and the lid, wherein the lid includes side walls held between an inner side of the frame and tension prongs arranged on the inner side of the frame.

2. A protective shield according to claim 1, wherein the lid includes side walls having outer dimensions corresponding to inner dimensions of the frame such that the lid and the frame are held together mechanically and are in electrical contact with each other.

3. A protective shield according to claim 2, wherein the side walls of the lid include at least one rib for mating with at least one rib on the frame.

4. A protective shield according to claim 2, wherein the frame includes at least one bulge for mating with at least one depression on the side walls of the lid.

5. A protective shield according to claim 2, wherein the frame includes at least one depression for mating with at least one bulge on the side walls of the lid.

6. A protective shield for electrical components on a circuit board, the protective shield comprising:

a frame;

a lid associated with the frame;

the frame having a side wall and the side wall having an end having a flange, the flange having a surface extending perpendicularly to the side wall and adapted to be fastened to a circuit board by gluing, welding or soldering, the frame being adapted to surround at least one component, wherein electrical contact is formed between the circuit board and the frame and between the frame and the lid, wherein the lid includes side walls held between an outside side of the frame and tension prongs arranged on the outside of the frame.

7. A protective shield according to claim 6, wherein the lid includes side walls having inner dimensions corresponding to outer dimensions of the frame such that the lid and the frame are held together mechanically and are in electrical contact with each other.

8. A protective shield according to claim 7, wherein the lid includes a plurality of tongues arranged along the side walls and directed out from a center of the lid.

9. A protective shield for electrical components on a circuit board, the protective shield comprising:

a frame;

a lid associated with the frame;

the frame having a side wall and the side wall having an end having a flange, the flange having a surface extending perpendicularly to the side wall and adapted to be fastened to a circuit board by gluing, welding or soldering, the frame being adapted to surround at least one component, wherein electrical contact is formed between the circuit board and the frame and between the frame and the lid, wherein the lid includes side walls having outer dimensions corresponding to inner dimensions of the frame such that the lid and the frame are held together mechanically and are in electrical contact with each other, and wherein the lid includes a plurality of tongues arranged along the side walls and directed out from a center of the lid.

10. A protective shield according to claim 9, wherein the tongues, at free ends thereof, are bent in towards the side walls.

11. A protective shield according to claim 10, wherein the flange extends in towards a center of the frame.

12. A protective shield according to claim 10, wherein the flange extends out from a center of the frame.

\* \* \* \* \*